(12) United States Patent
Do

(10) Patent No.: US 6,975,528 B2
(45) Date of Patent: Dec. 13, 2005

(54) READ ONLY MEMORY DEVICE

(75) Inventor: Young-Sook Do, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/756,962

(22) Filed: Jan. 13, 2004

(65) Prior Publication Data

US 2004/0151015 A1 Aug. 5, 2004

(30) Foreign Application Priority Data

Feb. 4, 2003 (KR) .................................. 10-2003-0006941

(51) Int. Cl.⁷ .............................................. G11C 17/00
(52) U.S. Cl. .................... 365/94; 365/104; 365/210
(58) Field of Search ........................ 365/94, 104, 210, 365/230.03

(56) References Cited

U.S. PATENT DOCUMENTS 5,394,371 A * 2/1995 Hotta ............................ 365/94
6,347,047 B2 * 2/2002 Kohno ......................... 365/104

* cited by examiner

Primary Examiner—Huan Hoang
(74) Attorney, Agent, or Firm—Marger Johnson & McCollom, P.C.

(57) ABSTRACT

The present invention relates to an improved read only memory device. The read only memory device includes a read only memory cell array with a plurality of first read only memory cells and a plurality of second read only memory cells. A reference memory cell array includes a plurality of first reference memory cells and at least one second reference memory cell. A dummy memory cell array includes a plurality of first dummy memory cells and a plurality of second dummy memory cells. A reference word line selecting circuit selects the reference word line responsive to a row address.

18 Claims, 7 Drawing Sheets

READ ONLY MEMORY DEVICE

This U.S. patent application claims priority under 35 U.S.C. §119 to Korean Patent Application 2003-6941 filed on Feb. 4, 2003, the contents of which are hereby incorporated by reference.

BACKGROUND OF THE INVENTION

1. Field of the Invention

The present invention relates to a memory device and, more particularly, to a read only memory device.

2. Description of Related Art

A memory cell array of a conventional read only memory device includes a read only memory cell array for storing data and programs, a reference memory cell array for generating a reference voltage, and a dummy memory cell array for generating a sense amplifier enable signal.

A reference voltage generated from the reference memory cell array is set at an intermediate level between a "high" level and a "low" level. The reference voltage is applied to bit lines of the read only memory cell array. A signal generated from the dummy memory cell array generates a sense amplifier enable signal for enabling the sense amplifier.

In the conventional read only memory device, however, the reference memory cell array connected to each of word lines and NMOS transistors of the dummy memory cell array have different characteristics according to process distributions. These process distribution allow for the generation of the reference voltage by the reference memory cell array and generation of the sense amplifier enable signal by the dummy memory cell array at different times. The result is higher data read errors. Accordingly, a need remains for an improved read only memory device.

SUMMARY OF THE INVENTION

It is an object of the present invention to provide a memory device that addresses some of the disadvantages associated with prior memory cell devices.

It is an object of the present invention to provide a read only memory device that addresses the disadvantages associated with prior memory devices.

It is another object of the present invention to provide a read only memory device capable of generating a constant reference voltage and sense amplifier enable signals regardless of a process distribution.

An embodiment of the present invention provides a read only memory device, comprising a read only memory cell array, a reference memory cell array, and a dummy memory cell array. The read only memory cell array includes a plurality of first read only memory cells coupled to a plurality of word lines, a plurality of first bit lines, and a plurality of first virtual ground lines and a plurality of second read only memory cells coupled to a reference word line, a plurality of second bit lines, and a plurality of second virtual ground lines. The reference memory cell array includes a plurality of first reference memory cells coupled to a plurality of dummy word lines, at least one reference bit line, and at least one reference virtual ground line and at least one second reference memory cells coupled to the reference word line, the at least one reference bit line, and the at least one reference virtual ground line. The dummy memory cell array includes a plurality of first dummy memory cells coupled to the plurality of dummy word lines, at least one dummy bit line, and at least one dummy virtual ground line and a plurality of second dummy memory cells coupled to the reference word line, the at least one dummy bit line, and the at least one dummy virtual ground line.

A row decoder decodes a row address that selects the plurality of word lines.

A reference word line selecting circuit selects a reference word line responsive to the row address.

A first column decoder and virtual ground line selecting circuit decodes a column address that selects the plurality of bit lines and the plurality of the first virtual ground lines.

A second column decoder and virtual ground line selecting circuit selects the at least one reference bit line and the at least one dummy bit line responsive to the column address.

BRIEF DESCRIPTION OF THE DRAWINGS

For a more complete understanding of the present invention and the advantages thereof, reference is now made to the following descriptions taken in conjunction with the accompanying drawings. Like reference numerals denote like parts.

DETAILED DESCRIPTION OF EMBODIMENTS

Reference will now be made to embodiments of the present invention, example of which is illustrated in the accompanying drawings.

Figure 1:
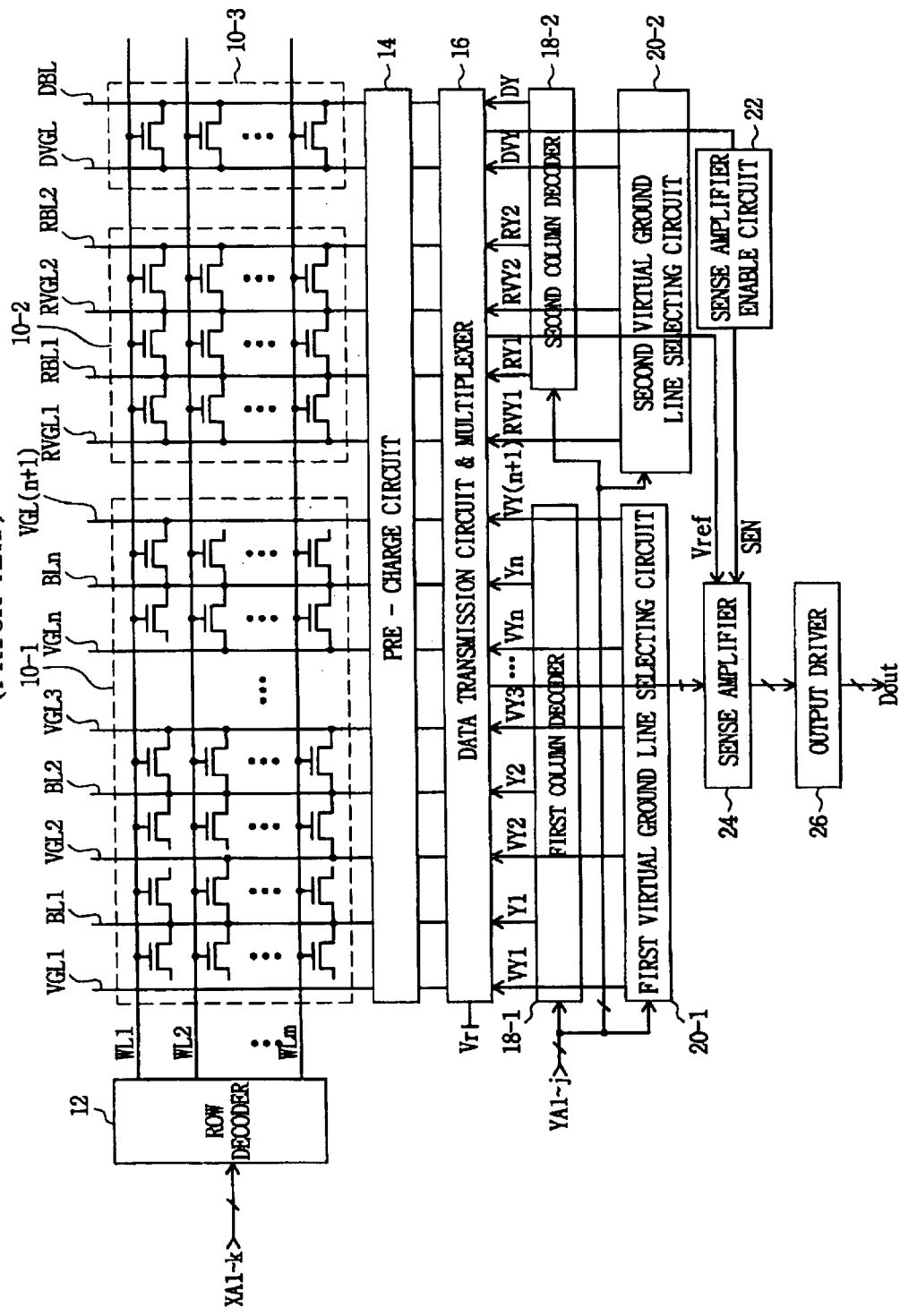
FIG. 1 is a block diagram of a conventional read only memory device.

FIG. 1 is a block diagram of a conventional read only memory device. The read only memory device of FIG. 1 includes a read only memory cell array 10-1, a reference memory cell array 10-2, and a dummy memory cell array 10-3, a row decoder 12, a pre-charge circuit 14, a data transmission circuit and multiplexer 16, first and second decoders 18-1 and 18-2, first and second virtual ground line selecting circuits 20-1 and 20-2, a sense amplifier enable circuit 22, a sense amplifier 24, and an output driver 24.

The read only memory device of FIG. 1 operates as follows. The read only memory cell array 10-1 is a memory cell array for storing data and programs. Virtual ground lines VGL1 to VGL(n+1) and bit lines BL1 to BLn are arranged alternately. Word lines WL1 to WLm are arranged perpendicularly to the virtual ground lines VGL1 to VGL(n+1). Each of NMOS transistors has a gate connected to a corresponding one of the word lines WL1 to WLm, a drain connected to a corresponding one of the bit lines BL1 to BLn, and a source coupled to a corresponding one of the virtual ground lines VGL1 to VGL(n+1). That is, drains of two neighboring NMOS transistors are commonly connected to one bit line. If a drain of an NMOS transistor is connected to the virtual ground line, it is at logic low, e.g., "0" state. If a drain of an NMOS transistor is disconnected from the virtual ground line, it is at a logic high, e.g., "1" state.

The reference memory cell array 10-2 includes NMOS transistors that have a gate connected to a corresponding one of the word lines WL1 to WLm, a drain connected to a corresponding one of reference bit lines RBL1 and RBL2, and a source connected to a corresponding one of reference virtual ground lines RVGL1 and RVGL2. That is, all of the NMOS transistors of the reference memory cell array 10-2 are at a logic low or "0".

The dummy memory cell array 10-3 includes NMOS transistors that have a gate connected to a corresponding one of the word lines WL1 to WLm, a drain connected to a dummy bit line DBL, and a source connected to a dummy virtual ground line DVGL. That is, like the NMOS transistors of the reference memory cell array 10-2, all of the NMOS transistors of the dummy memory cell array 10-3 at a logic low or "0". The row decoder 12 decodes the row address XA1~k to generate selecting signals for selecting the word lines WL1 to WLm. The pre-charge circuit 14 pre-charges the bit lines BL1 to BLn, RBL1, RBL2, and DBL and the virtual ground lines VGL1 to VGL(n+1), RVGL1, RVGL2, and DVGL before a read operation. The data transmission circuit and multiplexer 16 transmits data read from the bit lines BL1 to BLn in response to column selecting signals Y1 to Yn and a multiplexing control signal and applies a predetermined voltage Vr to the virtual bit lines VGL1 to VGL(n+1) in response to virtual ground line selecting signals VY1 to VY(n+1) and a multiplexing control signal. The data transmission circuit and multiplexer 16 also applies a predetermined voltage Vr to the reference virtual ground line RVGL2 in response to a reference column selecting signal RY1 and outputs a reference voltage Vref through the reference bit line RBL1. Further, the data transmission circuit & multiplexer 16 applies a predetermined voltage Vr to the dummy virtual ground line DVGL in response to a dummy column selecting signal DY and generates data output through the dummy bit line DBL. A first column decoder 18-1 decodes a column address YA1~j to generate column selecting signals Y1 to Yn. A second column decoder 18-2 detects an input of the column address YA1~j to generate the reference column selecting signal RY1 and the dummy column selecting signal DY and does not generate the reference column selecting signal RY2. A first virtual ground line selecting circuit 20-1 decodes the lowest bit address of the column address YA1~j to generate even- or odd-number virtual ground line selecting signals VY1 to VY(n+1). A second virtual ground line selecting circuit 20-2 generates the reference virtual ground line selecting signal RVY2 and the dummy virtual ground line selecting signal DVY when it is detected that the column address YA1~j is inputted. The sense amplifier enable circuit 22 receives data transmitted through the dummy bit line DBL to generate a sense amplifier enable signal SEN. The sense amplifier 24 is enabled in response to the sense amplifier enable signal SEN and amplifies a difference between data transmitted through the data transmission circuit & multiplexer 16 and the reference voltage Vref to generate an amplified signal. The output driver 26 drives the amplified signal outputted from the sense amplifier 24 to generate a data output signal Dout.

A read operation of the read only memory device having the above-described configuration is explained assuming that the word line WL1, the bit line BL1 and the virtual ground line VGL1 are selected.

Before a read operation is performed, the bit lines BL1 to BLn, the virtual ground lines VGL1 to VGL(n+1), the reference bit lines RGBL1 and RBL2, the reference virtual ground lines RVGL1 and RVGL2, the dummy bit line DBL, and the dummy virtual ground line DVGL are pre-charged to a pre-charge voltage level by the pre-charge circuit 14.

When the row and column addresses XQ1~k and YA1~j of "00 . . . 0" are inputted, the row decoder 12 decodes the row address XA1~k to select the word line WL1. The first column decoder 18-1 decodes the column address YA1~k to generate a column selecting signal Y1. The first virtual ground line selecting circuit 20-1 decodes the lowest bit of the column address YA1~j to generate the odd-number virtual ground line selecting signals VY1, VY3, . . . , VY(n+1). The second column decoder 18-2 decodes the column address YA1~j to generate the reference column selecting signal RY1 and the dummy column selecting signal DY. That is, the second column decoder 18-2 generates the reference column selecting signal RY1 and the dummy column selecting signal DY when an input of the column address YA1~j is detected. The second virtual ground line selecting circuit 20-2 generates the reference virtual ground line selecting signal RVY2 and the dummy virtual ground line selecting signal DVY in response a signal generated by decoding the lowest bit of the column address YA1~j. That is, the second virtual ground line selecting circuit 20-2 selects the reference virtual ground line selecting signal RVY2 and the dummy ground line selecting signal DVY when an input of the column address YA1~k is detected.

When the column selecting signal Y1 and the virtual ground line selecting signal VY1 are selected, a discharge path is not formed through the NMOS transistor connected the word line WL1 and the bit line BL1, so that a voltage of the bit line BL1, i.e., a signal at a logic high level which is a pre-charge voltage level is output through the data transmission circuit and multiplexer 16. When the reference column selecting signal RY1 and the reference virtual ground line selecting signal RVY2 are selected, a discharge path is formed through the NMOS transistor connected the word line WL1 and the bit line BL1, so that a charge of the reference bit line RBL1 is discharged to the reference virtual ground line RVGL2. The data transmission circuit and multiplexer 16 transmits a signal of "low" level of the reference bit line RBL1. Here, the data transmission circuit and multiplexer 16 discharges a voltage of the reference virtual ground line RVGL2 at the same speed as a discharge speed of the bit line BL1 in response to the reference column selecting signal RY1 and then stops discharging when a voltage of the bit line BL1 drops to a level of the reference voltage Vref. When the dummy column selecting signal DY and the dummy virtual ground line selecting signal DVY are selected, a discharge path is formed through the NMOS transistor connected the word line WL1 and the dummy bit line DBL. This discharges a charge of the dummy bit line DBL to the dummy virtual ground line DVGL. The data transmission circuit and multiplexer 16 transmits a logic low level dummy bit line DBL. The sense amplifier enable circuit 22 generates a sense amplifier enable signal SEN in response to a logic low signal transmitted through the data transmission circuit and multiplexer 16. The sense amplifier 24 amplifies a difference between the a signal of logic high signal output through the data transmission circuit & multiplexer 16 and the reference voltage Vref in response to the sense amplifier enable signal SEN to generate a signal of "high" level. The output driver 26 drives an amplified signal of logic high signal output through the sense amplifier 24 to generate the data output signal Dout.

In the conventional read only memory device, a voltage of the reference bit line which is changed by the NMOS transistor connected to the selected word line of the reference memory cell array is generated as the reference voltage. A voltage of the dummy bit line that is changed by the NMOS transistor connected to the selected word line of the dummy memory cell array is applied to the sense amplifier enable circuit.

However, since the NMOS transistors of the reference memory cell array and the dummy memory cell array that are respectively connected to the word lines WL1 to WLm, can have different characteristics according to the process distribution, of the generation of the reference voltage Vref and a signal applied to the sense amplifier enable signal generating circuit can vary. Errors can occur in data output from the sense amplifier 24 as a result.

Figure 2:
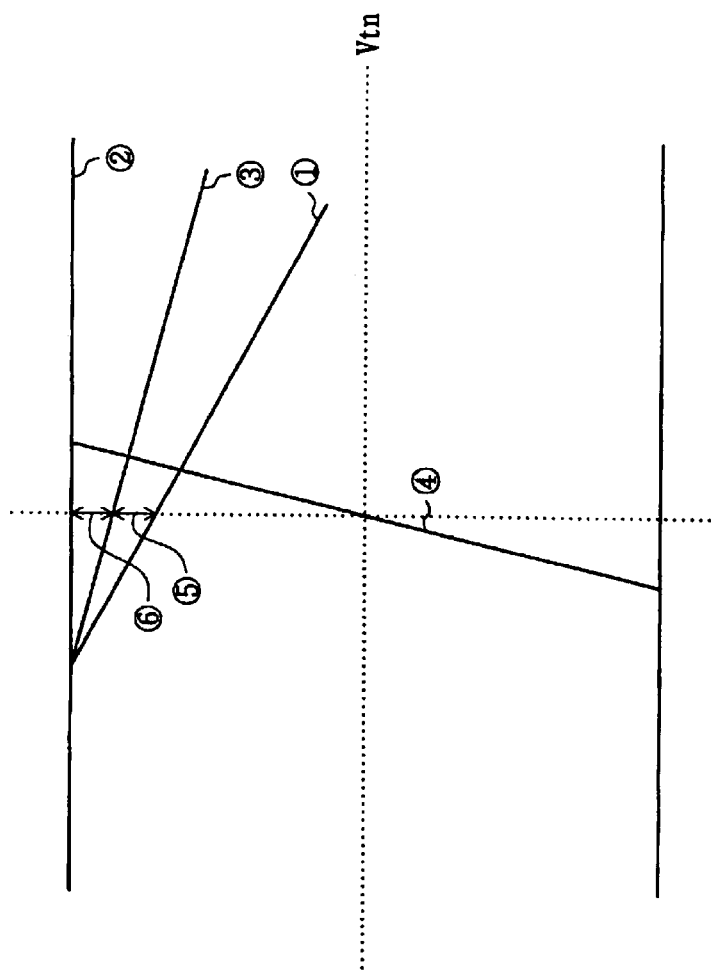
FIG. 2 is a timing diagram of a reference voltage and sense amplifier enable signal generation circuit in the conventional read only memory device.

FIG. 2 shows when a reference voltage and a sense amplifier enable signal are generated in the conventional read only memory device. A problem exists in the conventional read only memory device because generation of these voltages varies.

In FIG. 2, ③ indicates a variation of the reference voltage Vref generated from the reference memory cell array, ① indicates a voltage variation when a "low" level signal is transmitted to the bit line of the read only memory cell array, and ② indicates a voltage variation when a signal of "high" level is transmitted to the bit line of the read only memory cell array. The reference voltage Vref is designed to have an intermediate level between "low" and "high" all of which are transmitted to the bit line of the read only memory cell array. ④ indicates a generation time for the sense amplifier enable signal.

The sense amplifier detects a voltage difference at ⑤ between the reference voltage Vref and the logic low signal and detects a voltage difference at ⑥ between the reference voltage Vref and the logic high signal to generate an amplified logic high signal at a time when the sense amplifier enable signal SEN reaches a threshold voltage Vtn of an enable transistor (not shown) that constitutes the sense amplifier.

That is, the sense amplifier detects the voltage differences at ⑤ and ⑥ at a time to generate the amplified signal. A data read time is delayed when this enable time is delayed. A data read error might occur when the voltage differences at ⑤ and ⑥ are not secured due to a variation of a level of the reference voltage Vref at the enable time point.

As shown in FIG. 1, however, in the conventional read only memory device, the reference voltage and a signal applied to the sense amplifier enable circuit varies according to the NMOS transistor connected to the selected word line. This is because the selected NMOS transistors have different characteristics according to their process distributions.

Figure 3:
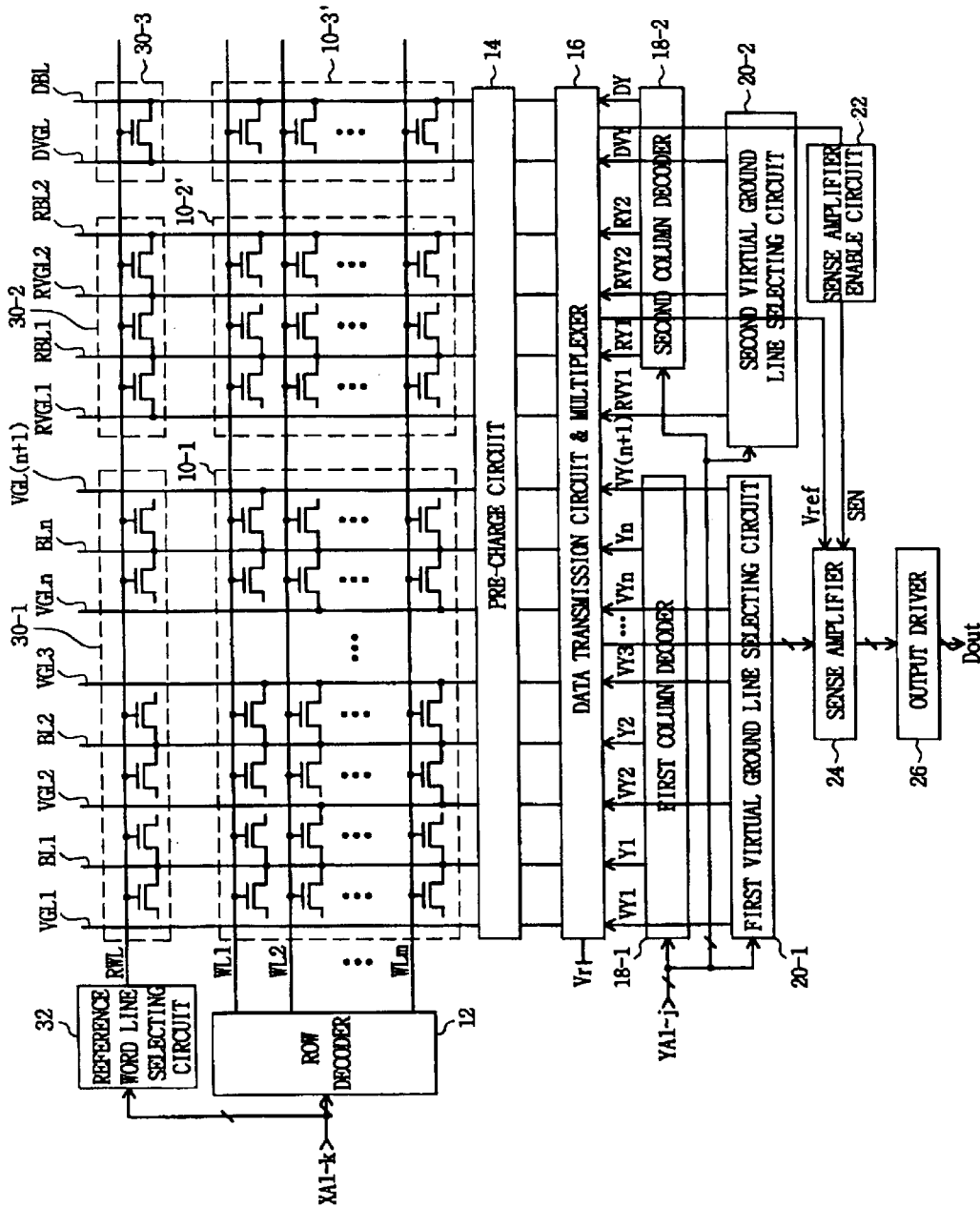
FIG. 3 is a block diagram of a first embodiment of a read only memory device according to the present invention.

FIG. 3 is a block diagram illustrating a first embodiment of a read only memory device of the present invention. The read only memory device of FIG. 3 includes second read only memory cells 30-1, second reference memory cells 30-2, a second dummy memory cell 30-3, and a reference word line selecting circuit 32 in addition to the configuration of the read only memory device shown in FIG. 1.

In FIG. 3, the second read only memory cells 30-1 are programmed to a logic high (e.g., data "1") between the reference word line RWL, the bit lines BL1 to BLn, and the virtual ground lines VGL1 to VGL(n+1). The second reference memory cells 30-2 are programmed to a logic low (e.g., data "0") between the reference word line RWL, the reference bit lines RBL1 and RBL2, and the reference virtual ground lines RVGL1 and RVGL2. The second dummy memory cell 30-3 are programmed to a logic low (e.g., data "0") between the reference word line RWL, the dummy bit line DBL and the dummy virtual ground line DVGL.

That is, the NMOS transistors of the reference memory cell array 10-2 and the dummy memory cell array 10-3 of the read only memory device of FIG. 1 are programmed to a logic low, e.g., data "0", whereas NMOS transistors of a reference memory cell array 10-2' and a dummy memory cell array 10-3' of FIG. 3 are programmed to a logic high, e.g., data "1".

The read only memory device of FIG. 3 operates as follows. Many components of FIG. 3 perform the same function as FIG. 1. Where the components of FIG. 3 operate differently than those of FIG. 1, we explain below.

The second read only memory cells 30-1 is programmed to data, a logic high, e.g., "1" in order not to affect a read operation of the NMOS transistors of the first read only memory cells 10-1 even though the reference word line RWL is selected. The first reference memory cells 10-2' and the first dummy memory cells 30-2 are programmed to data "1" in order not to affect a read operation of the NMOS transistors of the second reference memory cells 30-2 and the second dummy memory cells 30-3 even though the word lines WL1 to WLm are selected. The second reference memory cells 30-2 discharge charges of the reference bit line RBL1 through the NMOS transistor when the reference word line RWL, the reference bit line RBL1 and the reference virtual ground line RVGL2 are selected and thus the NMOS transistor is selected. The second dummy memory cell 30-3 discharges charges of the dummy bit line DBL through the NMOS transistor when the reference word line RWL, the dummy bit line DBL and the dummy virtual ground line DVGL are selected. The reference word line selecting circuit 32 selects the reference word line RWL when an input of the row address XA1~k is detected. The read only memory device of the present invention varies a voltage of the reference bit line RBL1 only by the NMOS transistor connected between the reference bit line RBL1 and reference virtual ground line RVGL2 of the second reference memory cells 30-2, and varies a voltage of the dummy bit line DBL only by the NMOS transistor of the second dummy memory cell 30-3. The device generates a reference voltage Vref and an amplifier enable signal SEN at a constant point in time regardless of the process distribution.

A read operation of the read only memory device of FIG. 3 operates as follows. The following description assumes selection of the word line WL1, the bit line BL1, and the virtual ground line VGL1.

The pre-charge operation that occurs before a read operation is substantially the same as that described earlier relative to FIG. 1.

When the row and column addresses XA1~k and YA1~j are at a logic low, e.g., "00 . . . 0" the same operation as that of FIG. 1 is performed, so that the word line WL1, the reference word line RWL, the bit line BL1, the virtual ground line VGL1, the reference bit line RBL1, the reference virtual ground line RVGL2, the dummy bit line DBL, and the dummy virtual ground line DVGL are selected.

As a result, a discharge path is not formed through the NMOS transistor connected to the word line WL1 and the bit line BL1, so that a voltage of the bit line BL1, i.e., a logic "high" level signal that is a pre-charge voltage level, is output through the data transmission circuit & multiplexer 16. A discharge path is formed through the NMOS transistor connected to the reference word line RWL and the reference bit line RBL1, so that the reference bit line RBL1 is discharged to the reference virtual ground line RVGL2. The data transmission circuit & multiplexer 16 outputs a signal of the reference bit line RBL1 as the reference voltage Vref. Also, a discharge path is formed through the NMOS transistor connected to the reference word line RWL and the dummy bit line DBL, so that the dummy bit line DBL is discharged to the dummy virtual ground line DVGL. The data transmission circuit & multiplexer 16 transmits a logic low signal dummy bit line DBL.

The sense amplifier enable circuit 22, the sense amplifier 24 and the output driver 26 perform the same operation as those of FIG. 1.

In the inventive read only memory device, the reference word line RWL is selected when the word lines WL1 to WLm are selected. A reference voltage is generated by discharging a voltage of the reference bit line RBL1 through the NMOS transistor connected between the reference bit line RBL1 and the reference virtual ground line RVGL2 of the second reference memory cells 30-2. A logic low signal generated by discharging a voltage of the dummy bit line DBL through the NMOS transistor of the second dummy memory cell 30-3 is output to the sense amplifier enable circuit. The reference voltage Vref and the sense amplifier enable signal SEN, are, therefore, generated at a constant point in time remains constant regardless of the process distribution.

Figure 4:
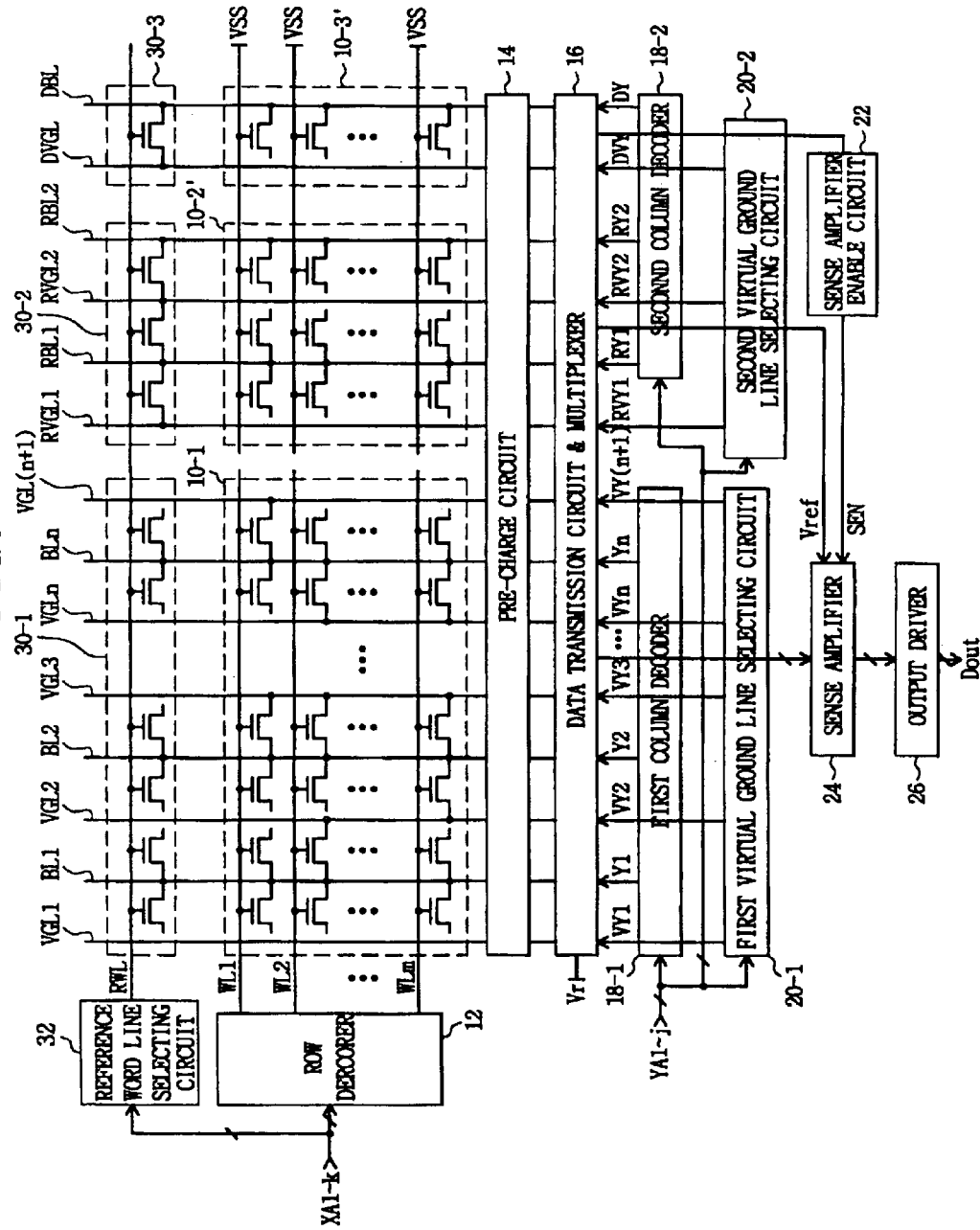
FIG. 4 is a block diagram of a second embodiment of a read only memory device according to the present invention.

FIG. 4 is a block diagram illustrating a second embodiment of a read only memory device of the present invention. The read only memory device of FIG. 4 has the same configuration of that of FIG. 3 except that a level of a ground voltage VSS is applied to the word lines of the first reference memory cells 10-2' and the first dummy memory cells 10-3'.

That is, the reference word line RWL and the dummy word lines DWL1 to DWLm are not connected to the word lines WL1 to WLm of the first read only memory cells 10-1 and is configured such that a ground voltage VSS level is applied thereto.

The read only memory device of FIG. 4 operates similarly to the device of FIG. 3.

Figure 5:
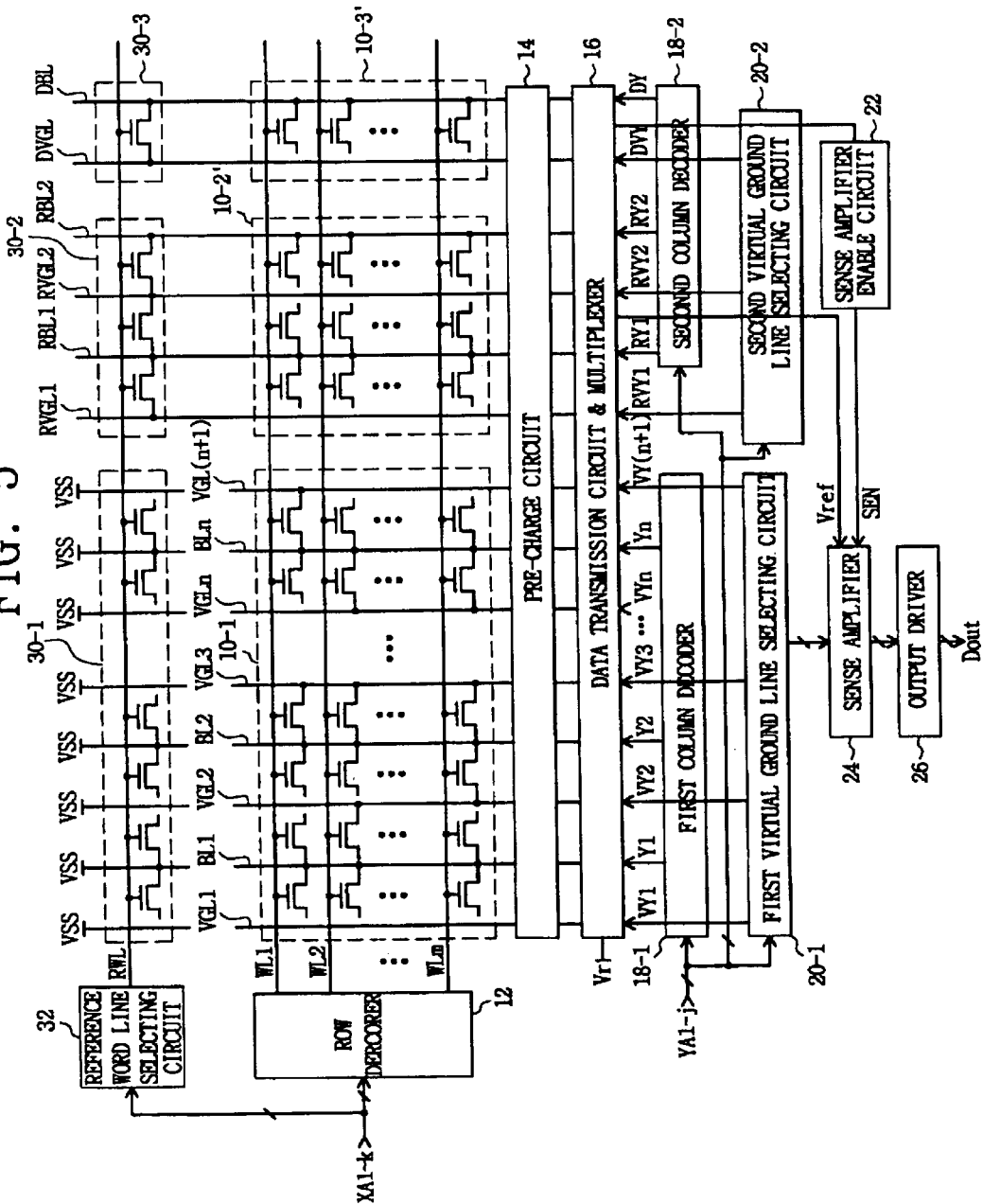
FIG. 5 is a block diagram of a third embodiment of a read only memory device according to the present invention.

FIG. 5 is a block diagram illustrating a third embodiment of a read only memory device of the present invention. The read only memory device of FIG. 5 has the same configuration of that of FIG. 3 except that the second bit lines and the virtual ground lines (i.e., second virtual ground lines) of the second read only memory cells 30-1 are not connected to the bit lines BL1 to BLn and the virtual ground lines VGL1 to VGL(n+1) of the read only memory cells 10-1. Instead, the second bit lines and the second virtual ground lines receive a ground voltage VSS level.

The read only memory device of FIG. 5 operates similarly to the device of FIG. 3.

Even though not shown, a voltage is not applied to the second bit lines and the second virtual ground lines resulting in them remaining in a floating state.

Figure 6:
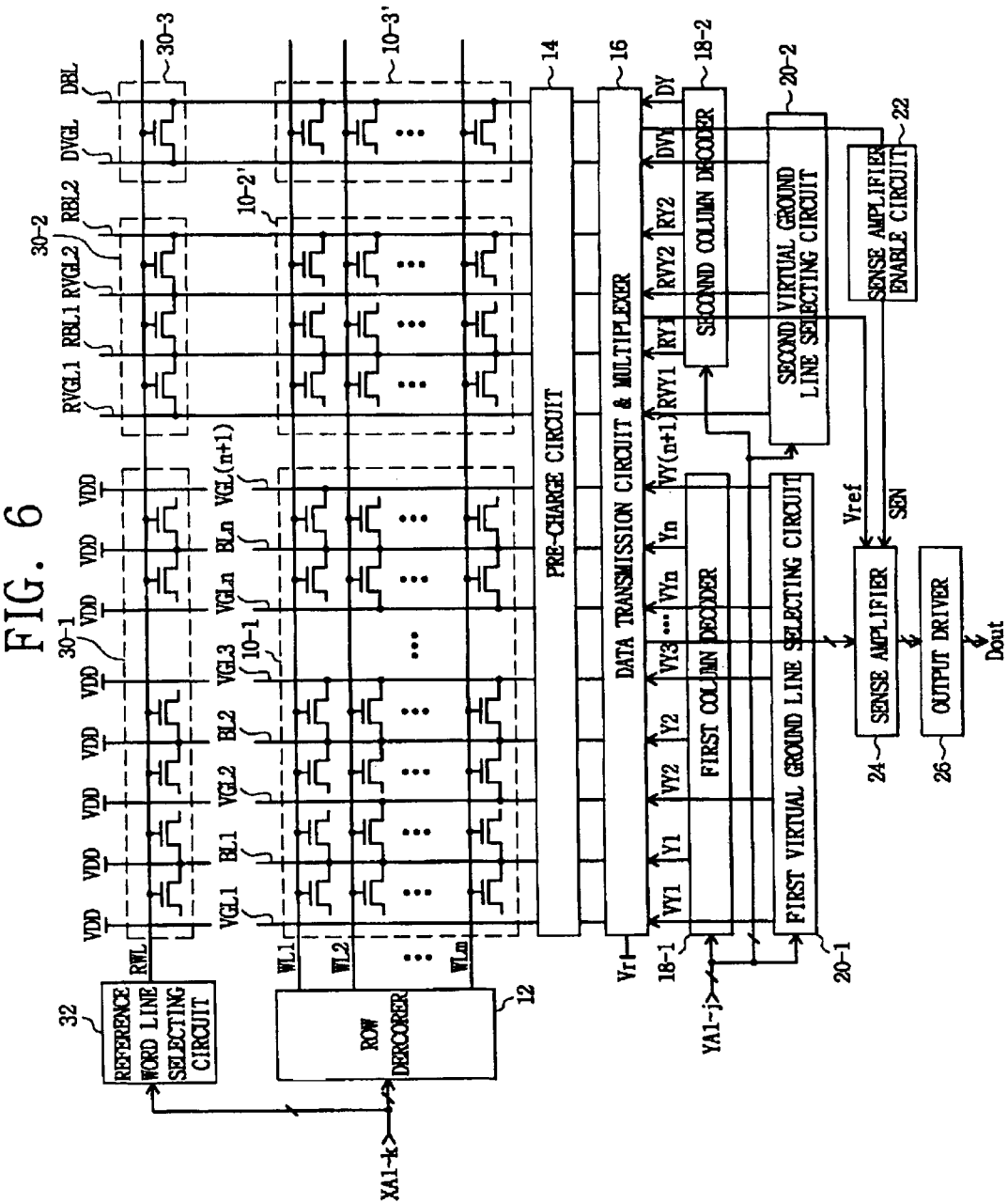
FIG. 6 is a block diagram of a fourth embodiment of a read only memory device according to the present invention.

FIG. 6 is a block diagram illustrating a fourth embodiment of a read only memory device of the present invention. The read only memory device of FIG. 6 has the same configuration of that of FIG. 5 except that a power voltage VDD level is applied to the second bit lines and the second virtual ground lines.

The read only memory device of FIG. 6 operates similarly to the device of FIG. 3.

Figure 7:
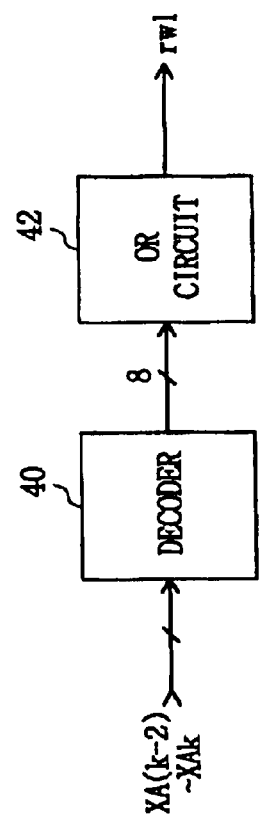
FIG. 7 is a block diagram of a reference word line driving circuit of the read only memory device according to the present invention.

FIG. 7 is a block diagram illustrating the reference word line selecting circuit of the inventive read only memory device. The reference word line selecting circuit of FIG. 7 includes a decoder 40 and an OR circuit 42.

The reference word line selecting circuit of FIG. operates as follows.

The decoder 40 decodes the lowest 3-bits XA(k−2) to XAk of the low address XA1~k to generate 8 decoding signals. That is, the decoder 40 generates a logic high decoding signal when the row address is inputted. The OR circuit 42 ORs 8 decoding signals to generate a reference word line selecting signal rw1 for selecting the reference word line RWL. The OR circuit 42 generates a logic high reference word line selecting signal rw1 when the row address is input.

The read only memory device of the present invention is described using the embodiments described above but can have other modifications that come within the scope of the present invention. The second read only memory cells 30-1 added to the read only memory cell array 10-1 do not affect operation of the first read only memory cells 10-1. The first reference memory cells 10-2' do not affect operation of the second reference memory cells 30-2. The first dummy memory cells 10-3' do not affect operation of the second dummy memory cells 30-3. This all provided that the second read only memory cells 30-1, the first reference memory cells 10-2' and the first dummy memory cells 10-3', play a role making constant a word line load of the word lines WL1 to WLm and the reference word line RWL and a bit line load of the bit lines BL1 to BLn and the reference bit lines RBL1 and RBL2 and the dummy bit line DBL be constant.

In the above-described embodiments, even though one NMOS transistor of the second dummy memory cell 30-3 is provided, preferably a predetermined number of NMOS transistors are provided in order to increase a current driving ability. That is, the second dummy memory cell 30-3 preferably includes a predetermined number of NMOS transistors that have a source connected to the dummy virtual ground line DVGL, a drain connected to the dummy bit line DBL, and a gate connected to the reference word line RWL.

The memory cells of the read only memory device of the present invention are shown programmed by connection to a source. The memory cells might be alternately programmed by varying an impurity implanting density.

In the above described embodiments, the memory cells of the inventive read only memory device are connected to the virtual ground line, but the memory cells can be connected to a ground line other than the virtual ground line.

As described herein before, the read only memory device of the present invention can generate the constant reference voltage regardless of the process distribution and make a time point that the sense amplifier enable signal be constant. Therefore, a data read error could be prevented.

While the invention has been particularly shown and described with reference to preferred embodiments thereof, it will be understood by those skilled in the art that the foregoing and other changes in form and details may be made therein without departing from the spirit and scope of the invention.

We claim:

1. A read only memory device, comprising:
   a read only memory cell array including:
      a plurality of first read only memory cells coupled to a plurality of word lines, a plurality of first bit lines, and a plurality of first virtual ground lines; and
      a plurality of second read only memory cells coupled to a reference word line, a plurality of second bit lines and a plurality of second virtual ground lines;

a reference memory cell array including:
  a plurality of first reference memory cells coupled to a plurality of dummy word lines, at least one reference bit line, and at least one reference virtual ground line; and
  at least one second reference memory cell coupled to the reference word line, the at least one reference bit line, and the at least one reference virtual ground line; and
a dummy memory cell array including:
  a plurality of first dummy memory cells coupled to the plurality of dummy word lines, at least one dummy bit line, and at least one dummy virtual ground line; and
  at least one second dummy memory cells coupled to the reference word line, the at least one dummy bit line, and the at least one dummy virtual ground line;
where the reference word line is selected when at least one of the plurality of word lines is selected.

2. The device of claim 1 comprising:
a row decoder to decode a plurality of word lines responsive to an address;
a reference word line selecting circuit to generate a reference word line responsive to the address, the reference word line selecting circuit being distinct from the row decoder.

3. The device of claim 2
where at least one second reference memory cell is programmed to data "0;" and
where the at least one second dummy memory cell is programmed to data "0."

4. The device of claim 3
where the plurality of dummy word lines is connected to the plurality of word lines; and
where the plurality of first dummy memory cells are programmed to data "1."

5. The device of claim 3
where the plurality of dummy word lines is connected to a power voltages; and
where the plurality of first dummy memory cells are programmed to data "1."

6. The device of claim 3 where the plurality of dummy word lines is connected to a ground voltage.

7. The device of claim 3
where the plurality of of second bit lines and the plurality of second virtual ground lines is permanently connected to the plurality of word lines; and
where the plurality of first reference memory cells are programmed to data "1."

8. The device of claim 3
where the plurality of second bit lines is coupled to the plurality of first bit lines;
where the plurality of second virtual ground lines is coupled to the plurality of first virtual ground lines; and
where the plurality of second read only memory cells is programmed to a data "1."

9. The device of claim 3 comprising a MOS transistor having a gate coupled to the reference word line.

10. The device of claim 3 where the read only memory cell array includes an NMOS transistor having a gate coupled to the reference word line.

11. The device of claim 3 where the at least one second reference memory cell includes an NMOS transistor.

12. The device of claim 3 where the at least one second dummy memory cell includes an NMOS transistor.

13. The device of claim 3
where the plurality of dummy word lines is connected to a power voltage; and
where the plurality of first reference memory cells is programmed to a data "1."

14. The device of claim 3 where the plurality of dummy word lines is connected to a ground voltage.

15. The device of claim 3 the reference word line selecting circuit comprises:
a decoder to decode a portion of the address; and
a logic circuit to logically manipulate the decoded portion of the address from the decoder.

16. A read only memory device, comprising:
a read only memory cell array including;
  a plurality of first read only memory cells coupled to a plurality of word lines, a plurality of first bit lines, and a plurality of first virtual ground lines; and
  a plurality of second read only memory cells coupled to a reference word line, a plurality of second bit lines, and a plurality of second virtual ground lines;
a reference memory cell array including:
  a plurality of first reference memory cells coupled to a plurality of dummy word lines, at least one reference bit line, and at least one reference virtual ground line; and
  a plurality of second reference memory cells coupled to the reference word line, the at least one reference bit line, and the at least one reference virtual ground line; and
a dummy memory cell array including:
  a plurality of first dummy memory cells coupled to the plurality of dummy word lines, at least one dummy bit line, and at least one dummy virtual ground line; and
  a plurality of second dummy memory cells coupled to the reference word line, the at least one dummy bit line, and the at least one dummy virtual ground line;
a row decoder to decode a row address that selects the plurality of word lines;
a reference word line selecting circuit to select a reference word line responsive to the row address;
a first column decoder and virtual ground line selecting circuit to decode a column address that selects the plurality of bit lines and the plurality of the first virtual ground lines; and
a second column decoder and virtual ground line selecting circuit to select the at least one reference bit line and the at least one dummy bit line responsive to the column address
where the reference word line selecting circuit selects the reference word line when at least one of the plurality of word lines is selected.

17. The device of claim 16 where the reference word line selecting circuit decodes predetermined bits of the row address.

18. The device of claim 16, where the reference word line selecting circuit includes:
a decoder to decode a portion of the row address to output decoding signals; and
a logic circuit to logically manipulate the decoding signals.

* * * * *

UNITED STATES PATENT AND TRADEMARK OFFICE
CERTIFICATE OF CORRECTION

PATENT NO.       : 6,975,528 B2
APPLICATION NO.  : 10/756962
DATED            : December 13, 2005
INVENTOR(S)      : Do It is certified that error appears in the above-identified patent and that said Letters Patent is hereby corrected as shown below:

At column 5, line 56 please replace "FIG. 3" with --FIG. 1--
At column 5, line 59 please replace "addition to the" with --addition of a--
At column 8, line 10 please replace "rw1" with --rwl--
At column 8, line 12 please replace "rw1" with --rwl--
At column 9, line 15 please replace "cells" with --cell--
At column 9, line 40 please replace "voltages" with --voltage--
At column 10, line 16 please replace "including;" with --including:--
At column 10, line 53 please replace "address" with --address;--

Signed and Sealed this

Sixteenth Day of January, 2007

JON W. DUDAS
*Director of the United States Patent and Trademark Office*